United States Patent
Shimada

(10) Patent No.: US 10,187,074 B2
(45) Date of Patent: Jan. 22, 2019

(54) TIMING SIGNAL GENERATION DEVICE, ELECTRONIC DEVICE, AND MOVING OBJECT

(71) Applicant: Seiko Epson Corporation, Tokyo (JP)

(72) Inventor: Hiroyuki Shimada, Suwa (JP)

(73) Assignee: Seiko Epson Corporation (JP)

( * ) Notice: Subject to any disclaimer, the term of this patent is extended or adjusted under 35 U.S.C. 154(b) by 205 days.

(21) Appl. No.: 15/383,253

(22) Filed: Dec. 19, 2016

(65) Prior Publication Data

US 2017/0187384 A1    Jun. 29, 2017

(30) Foreign Application Priority Data

Dec. 25, 2015    (JP) .................................. 2015-252783

(51) Int. Cl.

| | |
|---|---|
| H03L 7/26 | (2006.01) |
| H03B 17/00 | (2006.01) |
| G01S 19/37 | (2010.01) |
| H03L 1/02 | (2006.01) |
| H03L 7/23 | (2006.01) |
| H03L 7/099 | (2006.01) |

(52) U.S. Cl.
CPC .............. H03L 7/26 (2013.01); G01S 19/37 (2013.01); H03B 17/00 (2013.01); H03L 1/027 (2013.01); H03L 7/23 (2013.01); H03L 7/099 (2013.01)

(58) Field of Classification Search
CPC . H03L 7/26; H03L 1/027; H03L 7/099; H03L 7/23; G01S 19/37; H03B 17/00
USPC ......... 331/18, 2, 1 R, 46; 375/354; 713/400, 713/500
See application file for complete search history.

(56) References Cited

U.S. PATENT DOCUMENTS

| | | | | |
|---|---|---|---|---|
| 9,979,409 B2* | 5/2018 | Maki | ......................... | H03L 7/26 |
| 2015/0358026 A1* | 12/2015 | Gan | ......................... | G04F 5/14 |
| | | | | 331/94.1 |
| 2016/0274243 A1* | 9/2016 | Maki | ....................... | G01S 19/14 |

FOREIGN PATENT DOCUMENTS

| | | |
|---|---|---|
| JP | 2011-155367 A | 8/2011 |
| JP | 2012-129879 A | 7/2012 |
| JP | 2014-143653 A | 8/2014 |

\* cited by examiner

*Primary Examiner* — Arnold Kinkead
(74) *Attorney, Agent, or Firm* — Harness, Dickey & Pierce, P.L.C.

(57) ABSTRACT

A timing signal generation device includes a PLL circuit that synchronizes a first clock signal of an atomic oscillator with a reference timing signal of a GPS receiver, a PLL circuit that synchronizes a second clock signal of an oven-controlled crystal oscillator with the first clock signal, a first count reset unit that enables resetting of a count value of a divider in the PLL circuit when an operation of the PLL circuit is restarted, and a second count reset unit that enables resetting of a count value of a divider in the PLL circuit when the operation of the PLL circuit is restarted.

20 Claims, 13 Drawing Sheets

TIMING SIGNAL GENERATION DEVICE, ELECTRONIC DEVICE, AND MOVING OBJECT

CROSS REFERENCE

This application claims the benefit of Japanese Application No. 2015-252783 filed on Dec. 25, 2015. The disclosure of the prior application is hereby incorporated by reference herein in its entirety.

BACKGROUND

1. Technical Field

The present invention relates to a timing signal generation device, an electronic device, and a moving object.

2. Related Art

A timing signal generation device which performs synchronization with a precise timing signal included in a satellite signal and the like from, for example, a global positioning system (GPS) satellite, causes an oscillator such as a crystal oscillator or an atomic oscillator to oscillate, and thus generates a highly-precise timing signal has been known (for example, see JP-A-2012-129879).

In such a timing signal generation device, when, for example, a situation in which reception of the satellite signal is not possible occurs, generally, synchronization processing of synchronizing a clock signal of the oscillator with a timing signal included in the satellite signal is stopped, and the oscillator is caused to perform self-running, and thus a timing signal is generated. During self-running of the oscillator, phase shift between the timing signal included in the satellite signal, and the clock signal of the oscillator occurs depending on the time length thereof. Thus, when a situation in which receiving a satellite signal again is allowed occurs, the synchronization processing is restarted. However, at this time, it is necessary that the phase of the timing signal included in the satellite signal is rapidly synchronized with the phase of the clock signal of the oscillator.

For example, the synchronization signal generation device disclosed in JP-A-2012-129879 includes a GPS receiver which generates a GPS reference pulse from a signal received from a GPS satellite, an oscillator which generates an internal frequency signal, a divider which divides the internal frequency signal so as to generate an internal pulse, a synchronization unit which compares the GPS reference pulse and the internal pulse, and synchronizes the internal pulse with the GPS reference pulse, and a control unit that determines a loop time of the synchronization unit when a state comes back to a GPS lock state from a hold-over state, in accordance with a state of a base station. In the synchronization signal generation device, when the state comes back to the GPS lock state from the hold-over state, the control unit sets the loop time of the synchronization unit to have a small value, and thus it is possible to rapidly remove phase shift.

In the synchronization signal generation device disclosed in JP-A-2012-129879, in a case where a phase difference between the GPS reference pulse and the internal pulse is large, when the loop time of the synchronization unit is set to have a small value, a problem in that an output frequency largely fluctuates may occur.

SUMMARY

An advantage of some aspects of the invention is to provide a timing signal generation device which can reduce frequency fluctuation of a timing signal to be output and can rapidly synchronize the timing signal and a reference timing signal with each other, when synchronization with the reference timing signal is restarted, and to provide an electronic device and a moving object which include the timing signal generation device.

Such an advantage can be achieved by the following configurations.

A timing signal generation device according to an aspect of the invention includes a reference timing signal output unit that outputs a reference timing signal, a first oscillator that outputs a first clock signal, a first synchronization unit which includes a first divider that divides the first clock signal by counting the first clock signal, and outputs a first division clock signal obtained by the division, a first phase comparator that outputs a signal in accordance with a phase difference between the reference timing signal and the first division clock signal, and a first loop filter which is provided between the first phase comparator and the first oscillator, a second oscillator that outputs a second clock signal, a second synchronization unit which includes a second divider that divides the second clock signal by counting the second clock signal, and outputs a second division clock signal obtained by the division, a second phase comparator that outputs a signal in accordance with a phase difference between the first division clock signal and the second division clock signal, and a second loop filter which is provided between the second phase comparator and the second oscillator, a first count reset unit that enables resetting of a count value of the first divider when switching is performed from a state of stopping the first synchronization unit to a state of operating the first synchronization unit, and a second count reset unit that enables resetting of a count value of the second divider when switching is performed from a state of stopping the first synchronization unit to a state of operating the first synchronization unit.

According to such a timing signal generation device, when a state is switched from a state of stopping the first synchronization unit to a state of operating the first synchronization unit (for example, when switching is performed from a state when hold-over occurs to a state when a GPS is reset), the first count reset unit resets the count value of the first divider, and thus it is possible to reduce a phase difference and fluctuation thereof between the reference timing signal and the first division clock signal. Simultaneously with reset of the count value of the first divider or after the reset, the second count reset unit resets the count value of the second divider, and thus it is possible to also reduce a phase difference between the reference timing signal, and the first division clock signal and the second division clock signal. Accordingly, in the timing signal generation device according to the aspect of the invention, the second division clock signal is output as the timing signal, and thus it is possible to reduce frequency fluctuation of the timing signal to be output, and to rapidly synchronize the timing signal and a reference timing signal with each other, when synchronization with the reference timing signal is restarted.

It is preferable that the timing signal generation device according to the aspect of the invention includes a first time-constant adjustment unit is preferably provided which reduces a time constant of the first loop filter after the first count reset unit resets the count value of the first divider.

With this configuration, when switching is performed from the state of stopping the first synchronization unit to the state of operating the first synchronization unit, it is possible to rapidly synchronize the first division clock signal and the reference timing signal with each other. At this time, since the first count reset unit resets the count value of the first divider, and thus the phase difference between the reference timing signal and the first division clock signal is reduced, it is possible to reduce fluctuation of the first division clock signal even though the time constant of the first divider is reduced.

In the timing signal generation device according to the aspect of the invention, it is preferable that the first time-constant adjustment unit increases the time constant of the first loop filter when the phase difference between the first division clock signal and the reference timing signal is equal to or less than a setting value after the time constant of the first loop filter is reduced.

With this configuration, it is possible to reduce fluctuation of the first division clock signal.

In the timing signal generation device according to the aspect of the invention, it is preferable that each of the first count reset unit and the second count reset unit performs resetting when the phase difference between the first division clock signal and the reference timing signal is equal to or more than the setting value in a case where switching is performed from the state of stopping the first synchronization unit to the state of operating the first synchronization unit.

With this configuration, the count value of each of the first divider and the second divider is reset, and thus an effect (that is, an effect of reducing fluctuation of the timing signal when switching is performed from the state of stopping the first synchronization unit to the state of operating the first synchronization unit) is significantly shown.

In the timing signal generation device according to the aspect of the invention, it is preferable that the second count reset unit resets the count value of the second divider after the first count reset unit resets the count value of the first divider.

With this configuration, it is possible to reduce an influence of fluctuation of the first division clock signal, and to synchronize the first division clock signal and the second division clock signal with each other. The second oscillator performs self-running and oscillation for a period until the count values of both of the first divider and the second divider are reset. Thus, it is possible to output the second division clock signal as a timing signal with relatively high accuracy.

In the timing signal generation device according to the aspect of the invention, it is preferable that the second count reset unit resets the count value of the second divider when the phase difference between the first division clock signal and the reference timing signal is equal to or less than a setting value.

With this configuration, it is possible to clearly reduce an influence of fluctuation of the first division clock signal, and to synchronize the first division clock signal and the second division clock signal with each other.

In the timing signal generation device according to the aspect of the invention, it is preferable that the time constant of the first loop filter is more than the time constant of the second loop filter.

With this configuration, it is possible to obtain excellent responsiveness of the second synchronization unit and to reduce an occurrence of a situation in which the first division clock signal is influenced by the fluctuation of the reference timing signal.

In the timing signal generation device according to the aspect of the invention, it is preferable that long term stability of the first oscillator is higher than long term stability of the second oscillator.

With this configuration, it is possible to obtain excellent long-term frequency stability of the timing signal generation device when the first oscillator performs self-running and oscillation.

In the timing signal generation device according to the aspect of the invention, it is preferable that the first oscillator is an atomic oscillator.

With this configuration, it is possible to obtain very excellent long-term frequency stability of the timing signal generation device when the first oscillator performs self-running and oscillation.

In the timing signal generation device according to the aspect of the invention, it is preferable that the second oscillator is an oven-controlled crystal oscillator.

With this configuration, it is possible to obtain very excellent short-term frequency stability of the timing signal generation device when the first oscillator performs self-running and oscillation.

In the timing signal generation device according to the aspect of the invention, it is preferable that the reference timing signal output unit outputs the reference timing signal based on a satellite signal.

With this configuration, it is possible to use an accurate reference timing signal (1 PPS) synchronized with the coordinated universal time (UTC).

An electronic device according to another aspect of the invention includes the timing signal generation device according to the aspect of the invention.

With this configuration, it is possible to provide an electronic device including a timing signal generation device which can reduce frequency fluctuation of a timing signal to be output and can rapidly synchronize the timing signal and a reference timing signal with each other, when synchronization with the reference timing signal is restarted.

A moving object according to still another aspect of the invention includes the timing signal generation device according to the aspect of the invention.

With this configuration, it is possible to provide a moving object including a timing signal generation device which can reduce frequency fluctuation of a timing signal to be output and can rapidly synchronize the timing signal and a reference timing signal with each other, when synchronization with the reference timing signal is restarted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a timing signal generation device, an electronic device, and a moving object according to the invention will be described in detail, based on an embodiment illustrated in the accompanying drawings.

1. Timing Signal Generation Device

First Embodiment

Figure 1:
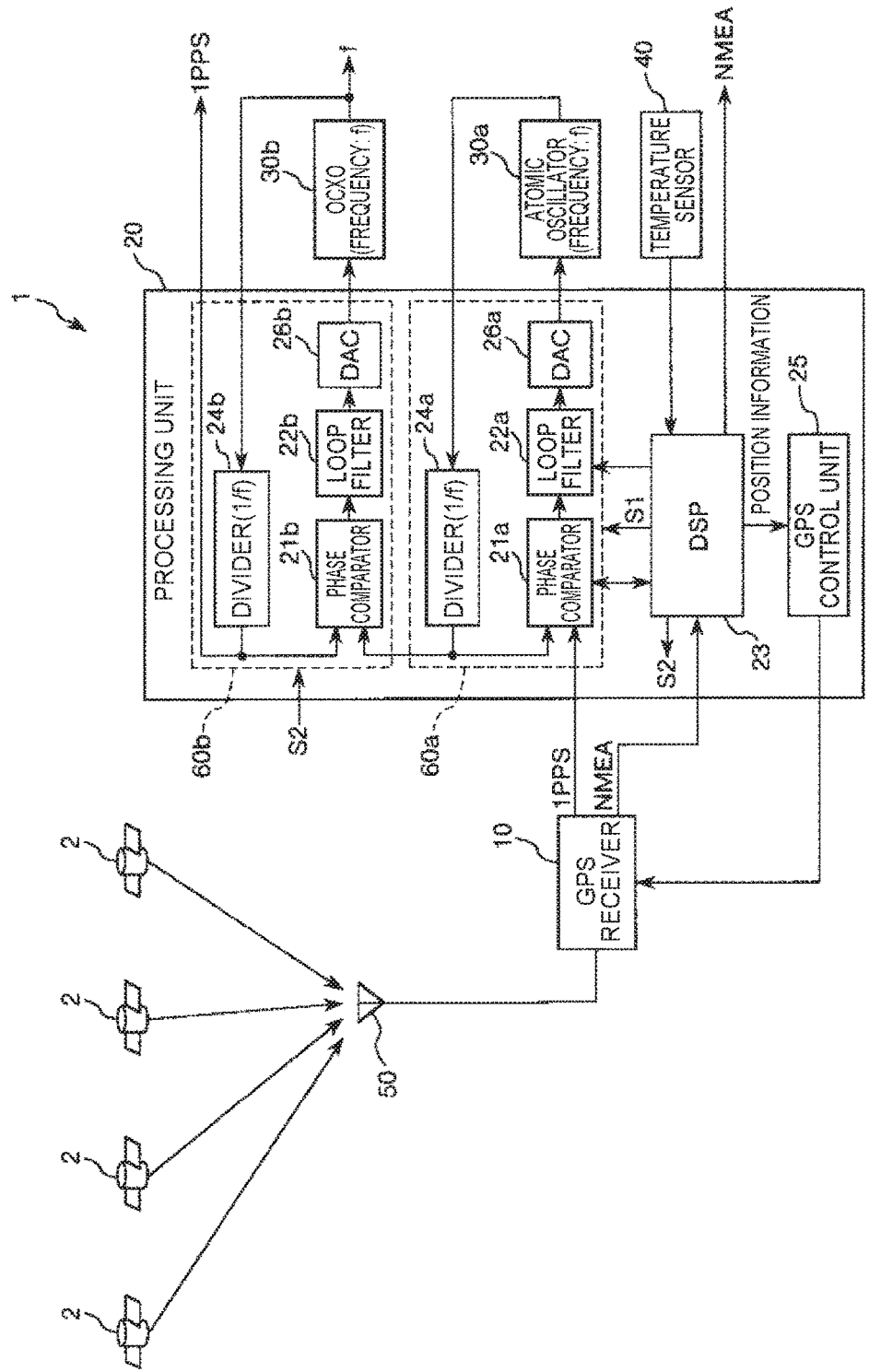
FIG. 1 is a schematic diagram illustrating a configuration of a timing signal generation device according to a first embodiment of the invention.

FIG. 1 is a schematic diagram illustrating a configuration of a timing signal generation device according to a first embodiment of the invention.

A timing signal generation device 1 illustrated in FIG. 1 includes a GPS receiver (reference-timing signal output unit) 10, a processing unit (CPU) 20, an atomic oscillator (first oscillator) 30a, an oven-controlled crystal oscillator (OXCO) (second oscillator) 30b, a temperature sensor 40, and a GPS antenna 50.

Some or all of the components of the timing signal generation device 1 may be physically separated or may be integrated. For example, each of the GPS receiver 10 and the processing unit (CPU) 20 maybe realized by using an individual IC. The GPS receiver 10 and the processing unit (CPU) 20 may be realized as a one-chip IC.

The timing signal generation device 1 receives a satellite signal transmitted from a GPS satellite (an example of a position information satellite) 2, and generates 1 PPS with high precision.

The GPS satellite 2 revolves on a predetermined orbit over the Earth and transmits a satellite signal to the ground. The satellite signal is obtained by superimposing a navigation message and a C/A (coarse/acquisition) code on a radio wave (L1 wave) of 1.57542 GHz serving as a carrier wave (by modulating the carrier wave).

The C/A code is used for identifying satellite signals of GPS satellites 2 of which the number is currently about 30. The C/A code has a unique pattern formed from 1023 chips (cycle of 1 ms) each of which has a value of either of +1 and −1. Accordingly, correlation between the satellite signal and the pattern of the C/A code is obtained, and thus, it is possible to detect a C/A code superimposed on the satellite signal.

The satellite signal (specifically, navigation message) transmitted by each of the GPS satellite 2 includes orbit information indicating a position of the corresponding GPS satellite 2 on an orbit thereof. Each of the GPS satellites 2 has an atomic clock mounted therein and the satellite signal includes very precise time information clocked by the atomic clock. Accordingly, satellite signals are received from four or more GPS satellites 2, positioning calculation is performed by using orbit information and time information which are included in each of the received satellite signals, and thus it is possible to obtain accurate information about a position and a point of time of a reception point (installation place of the GPS antenna 50). Specifically, a quartic equation in which a three-dimensional position (x, y, z) of the reception point and a point t of time functions as four variables may be established and the solution thereof may be obtained.

In a case where the position of a reception point is already known, satellite signals may be received from one GPS satellite 2 or more, and time information at the reception point may be obtained by using time information included in each of the satellite signals.

Information about a difference between a point of time in each of the GPS satellites 2 and a point of time at the reception point maybe obtained by using orbit information included in each of the satellite signals. A control segment on the ground measures a small time error of the atomic clock mounted in each of the GPS satellites 2, and the satellite signal also includes a time correction parameter for correcting the time error. Accordingly, a point of time at the reception point is corrected by using the time correction parameter, and thus very precise time information may be obtained.

GPS Receiver (Reference Timing Signal Output Unit)

The GPS receiver (an example of a satellite signal reception unit) 10 performs various types of processing based on the satellite signal received through the GPS antenna 50. Here, the GPS antenna 50 is an antenna for receiving various radio waves which include a satellite signal. The GPS antenna 50 is connected to the GPS receiver 10.

Specifically, the GPS receiver 10 has a normal positioning mode (an example of a first mode) and a position fix mode (an example of a second mode). Either of the normal positioning mode and the position fix mode is set in accordance with a control command (control command for setting a mode) from the processing unit (CPU) 20.

The GPS receiver 10 functions as "a positioning calculation unit" in the normal positioning mode. The GPS receiver 10 receives satellite signals transmitted from a plurality (preferably, 4 or more) of GPS satellites 2, and performs positioning calculation based on orbit information (specifically, the ephemeris data, the almanac data, or the like which is described above) included in the received satellite signal, and time information (specifically, the week number data, the Z count data, or the like which is described above). The normal positioning mode is a mode in which the positioning calculation is continuously performed.

In the position fix mode, the GPS receiver 10 functions as "the reference-timing signal output unit" that outputs a reference timing signal. The GPS receiver 10 receives satellite signals transmitted from at least one GPS satellite 2, and generates 1 pulse per second (1 PPS) as a reference timing signal, based on orbit information and time information which are included in the received satellite signals, and position information of the reception point which has been set. 1 PPS (an example of a reference timing signal synchronized with the reference point of time) is a pulse signal which has been completely synchronized with the universal time coordinated (UTC) and includes one pulse for each second. In this manner, the satellite signal used in generation of a reference timing signal by the GPS receiver 10 includes the orbit information and the time information, and thus a timing signal which is precisely synchronized with the reference point of time can be generated. The position fix mode is a mode in which 1 PPS is output based on preset position information.

Next, a configuration of the GPS receiver 10 will be described in detail.

Figure 2:
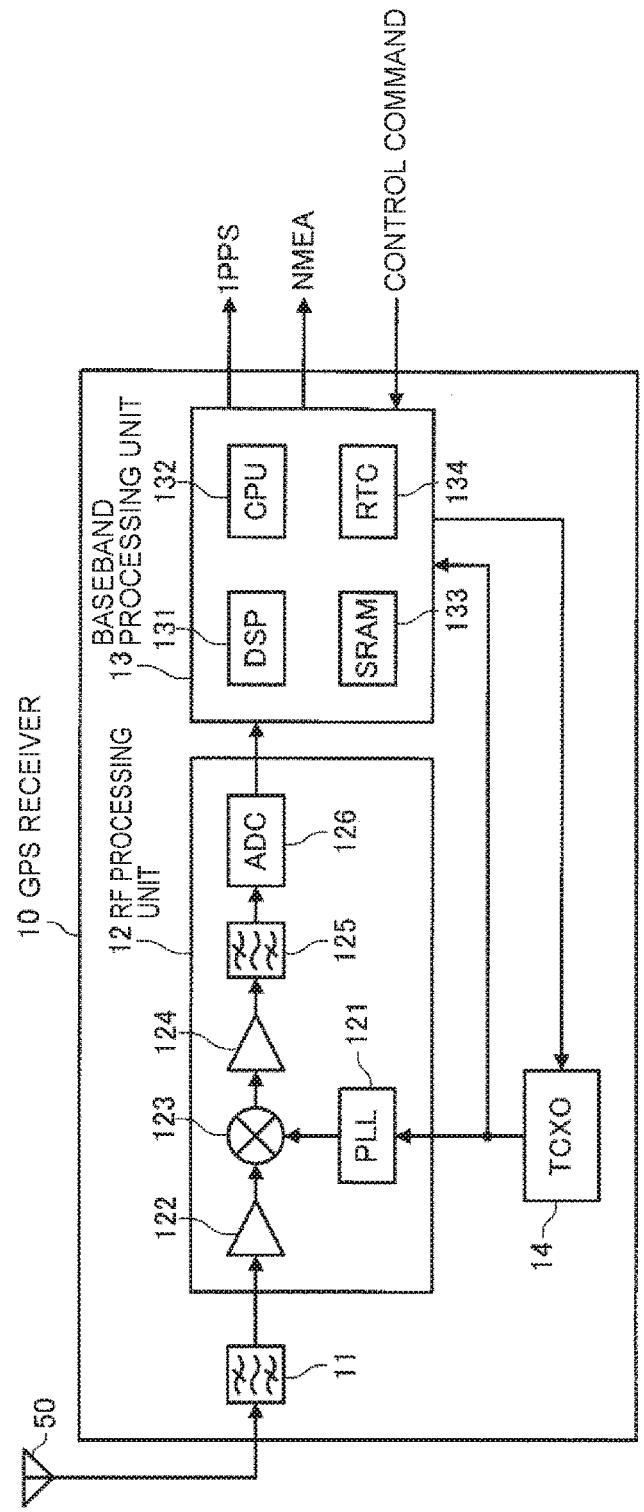
FIG. 2 is a block diagram illustrating a configuration example of a GPS receiver in the timing signal generation device illustrated in FIG. 1.

FIG. 2 is a block diagram illustrating a configuration example of the GPS receiver which is included in the timing signal generation device illustrated in FIG. 1.

The GPS receiver 10 illustrated in FIG. 2 includes a surface acoustic wave (SAW) filter 11, a RF processing unit 12, a baseband processing unit 13, and a temperature compensated crystal oscillator (TCXO) 14.

The SAW filter 11 performs processing of extracting a satellite signal from a radio wave received by the GPS antenna 50. The SAW filter 11 is configured as a bandpass filter through which a signal in a band of 1.5 GHz passes.

The RF processing unit 12 includes a phase locked loop (PLL) 121, a low noise amplifier (LNA) 122, a mixer 123, an IF amplifier 124, an intermediate frequency (IF) filter 125, and an A/D converter (ADC) 126.

The PLL 121 generates a clock signal obtained by multiplying an oscillation signal of the TCXO 14, which is oscillated at about tens of MHz so as to have a frequency of 1.5 GHz.

The LNA 122 amplifies the satellite signal extracted by the SAW filter 11. The mixer 123 mixes the satellite signal amplified by the LNA 122 with the clock signal output by the PLL 121, and thus the amplified satellite signal is down-converted into a signal (IF signal) in an intermediate frequency band (for example, several MHz). The signal obtained by mixing of the mixer 123 is amplified by the IF amplifier 124.

Since mixing of the mixer 123 causes a high frequency signal of the GHz order to be generated along with the IF signal, the IF amplifier 124 amplifies this high frequency signal along with the IF signal. The IF filter 125 passes through the IF signal and removes the high frequency signal (accurately, attenuated to be equal to or less than a predetermined level). The IF signal which passes through the IF filter 125 is converted into a digital signal by the A/D converter (ADC) 126.

The baseband processing unit 13 includes a digital signal processor (DSP) 131, a central processing unit (CPU) 132, a static random access memory (SRAM) 133, and a real-time clock (RTC) 134. The baseband processing unit 13 performs various types of processing by using the oscillation signal of the TCXO 14 as a clock signal.

The DSP 131 and the CPU 132 demodulates a baseband signal from the IF signal, obtains orbit information or time information which is included in a navigation message, and performs processing of the normal positioning mode or processing of the position fix mode, while cooperating with each other.

The SRAM 133 is used for storing the time information or the orbit information which is obtained, position information of the reception point which is set in accordance with a predetermined control command (control command for setting a position), an elevation angle mask used in, for example, the position fix mode, and the like. The RTC 134 generates a timing for performing baseband processing. A value of the RTC 134 is counted up by using a clock signal from the TCXO 14.

Specifically, the baseband processing unit 13 generates a local code having a pattern the same as each C/A code, and performs processing (satellite searching) of obtaining correlation between each C/A code included in the baseband signal, and the local code. The baseband processing unit 13 adjusts a timing of generating the local code such that a correlation value with respect to each of local codes becomes a peak. In a case where the correlation value is equal to or greater than a threshold value, the baseband processing unit 13 determines that synchronization with a GPS satellite 2 of which the local code corresponds to the C/A code is performed (the GPS satellite 2 is acquired). In the GPS, a code division multiple access (CDMA) method is employed. In the CDMA method, all GPS satellites 2 transmit satellite signals having the same frequency, by using different C/A codes. Accordingly, the C/A code included in the received satellite signal is determined and thus an acquirable GPS satellite 2 may be searched for.

The baseband processing unit 13 performs processing of mixing a local code having the same pattern as the C/A code of the acquired GPS satellite 2, with the baseband signal in order to obtain orbit information or time information of the acquired GPS satellite 2. A signal obtained by mixing includes a navigation message which includes the orbit information or the time information of the acquired GPS satellite 2 and is demodulated. The baseband processing unit 13 performs processing of obtaining the orbit information or the time information included in the navigation message, and storing the obtained information in the SRAM 133.

The baseband processing unit 13 receives a predetermined control command (specifically, control command for setting a mode), and performs setting of either of the normal positioning mode and the position fix mode. In the normal positioning mode, the baseband processing unit 13 performs positioning calculation by using pieces of the orbit information and the time information of four or more GPS satellites 2, which are stored in the SRAM 133.

In the position fix mode, the baseband processing unit 13 outputs 1 PPS which is highly precise, by using pieces of orbit information of one GPS satellites 2 or more, which are stored in the SRAM 133, and the position information of the reception point stored in the SRAM 133. Specifically, the baseband processing unit 13 includes an 1-PPS counter in a portion of the RTC 134. The 1-PPS counter counts a timing of generating a pulse at 1 PPS. The baseband processing unit 13 calculates a propagation delay period required for causing a satellite signal transmitted from the GPS satellite 2 to reach the reception point, by using the orbit information of the GPS satellite 2 and the position information of the reception point. The baseband processing unit 13 changes a setting value of the 1-PPS counter to the optimum value based on the calculated propagation delay period.

In the normal positioning mode, the baseband processing unit 13 may output 1 PPS based on the time information of the reception point obtained through the positioning calculation. In the position fix mode, if a plurality of GPS satellites 2 is acquired, the positioning calculation may be performed.

The baseband processing unit 13 outputs NMEA data which includes various types of information such as the position information or the time information obtained as results of the positioning calculation, and a reception status (the number of acquired GPS satellites 2, intensity of the satellite signal, and the like).

An operation of the GPS receiver 10 configured as described above is controlled by the processing unit (CPU) 20 illustrated in FIG. 1.

Processing Unit

The processing unit (an example of a satellite signal reception control device) 20 transmits various control commands to the GPS receiver 10 so as to control the operation of the GPS receiver 10. The processing unit 20 receives 1 PPS or the NMEA data which is output by the GPS receiver 10, and performs various types of processing. The processing unit 20 may perform various types of processing in accordance with, for example, a program stored in a certain memory.

The processing unit 20 includes phase comparators (first and second phase comparators) 21a and 21b, loop filters (first and second loop filters) 22a and 22b, a digital signal processor (DSP) (control unit) 23, dividers (first and second dividers) 24a and 24b, digital-analog conversion circuits (DACs) 26a and 26b, and a GPS control unit 25. The DSP 23 and the GPS control unit 25 may be configured by one component.

The DSP 23 (an example of a position information generation unit) obtains NMEA data from the GPS receiver 10 periodically (for example, for each second). The DSP 23 collects pieces of position information (result of the positioning calculation in the normal positioning mode by the GPS receiver 10) included in pieces of NMEA data, and creates statistical information for a predetermined period. The DSP 23 performs processing of generating position information of the reception point based on the created statistical information.

The DSP 23 has a function of controlling the PLL circuits 60a and 60b (which will be described later). Control of the PLL circuits 60a and 60b by the DSP 23 will be described later in detail.

The GPS control unit 25 transmits various control commands to the GPS receiver 10 so as to control an operation of the GPS receiver 10. Specifically, the GPS control unit 25 transmits a control command for setting a mode to the GPS receiver 10, and performs processing of causing the mode of the GPS receiver 10 to be switched from the normal positioning mode to the position fix mode. Before the GPS control unit 25 switches the mode of the GPS receiver 10 from the normal positioning mode to the position fix mode, the GPS control unit 25 transmits a control command for setting a position to the GPS receiver 10, and performs processing of setting the position information of the reception point, which has been generated by the DSP 23, in the GPS receiver 10.

The divider (first divider) 24a counts a clock signal (frequency: f) output by the atomic oscillator (first oscillator) 30a, performs f-division, and outputs a division clock signal (first division clock signal) of 1 Hz. The divider (second divider) 24b counts a clock signal (frequency: f) output by the oven-controlled crystal oscillator (second oscillator) 30b, performs f-division, and outputs a division clock signal (second division clock signal) of 1 Hz.

The phase comparator (first phase comparator) 21a compares a phase of 1 PPS (reference timing signal) output by the GPS receiver (reference timing signal output unit) 10, and a phase of the 1 Hz division clock signal output by the divider 24a. The phase comparator 21a outputs a phase difference signal depending on the phase difference. The phase difference signal of the phase comparator 21a is input to the atomic oscillator 30a through the loop filter (first loop filter) 22a and the digital-analog conversion circuit 26a. A parameter of the loop filter 22a provided between the phase comparator 21a and the atomic oscillator 30a as described above is set by the DSP 23. The 1 Hz division clock signal output by the divider 24a is synchronized with the 1 PPS output by the GPS receiver 10. As described above, the phase comparator 21a, the loop filter 22a, the divider 24a, and the digital-analog conversion circuit 26a constitute a phase locked loop (PLL) circuit 60a, and function as "a first synchronization unit". The first synchronization unit synchronizes the clock signal output by the atomic oscillator 30a, with 1 PPS. The digital-analog conversion circuit 26a may be configured so as to be integrated with the loop filter 22a.

The phase comparator (first phase comparator) 21b compares the phase of the 1 Hz division clock signal output by the divider 24a, and the phase of the 1 Hz division clock signal output by the divider 24b. The phase comparator 21b outputs a phase difference signal depending on the phase difference. The phase difference signal of the phase comparator 21b is input to the oven-controlled crystal oscillator 30b through the loop filter (second loop filter) 22b and the digital-analog conversion circuit 26b. A parameter of the loop filter 22b provided between the phase comparator 21b and the oven-controlled crystal oscillator 30b as described above is set by the DSP 23. The time constant of the loop filter 22b is smaller than the time constant of the loop filter 22a. The 1 Hz division clock signal output by the divider 24b is synchronized with the 1 Hz division clock signal output by the divider 24a. That is, the 1 Hz division clock signal output by the divider 24b is synchronized with 1 PPS output by the GPS receiver 10. As described above, the phase comparator 21b, the loop filter 22b, the divider 24b, and the digital-analog conversion circuit 26b constitute a phase locked loop (PLL) circuit 60b, and function as "a second synchronization unit". The second synchronization unit synchronizes the clock signal output by the oven-controlled crystal oscillator 30b, with 1 PPS. The digital-analog conversion circuit 26b may be configured so as to be integrated with the loop filter 22b.

The timing signal generation device 1 outputs the 1 Hz division clock signal output by the divider 24b, as 1 PPS which has been synchronized with the UTC and has very high frequency accuracy, to the outside of the device 1. The timing signal generation device 1 outputs the latest NMEA data outwardly for each second, with synchronization with 1 PPS.

Atomic Oscillator (First Oscillator)

The atomic oscillator 30a is an oscillator that enables an output of a clock signal having high frequency accuracy by using atomic energy transition of, for example, a rubidium atom or a cesium atom. Examples of the atomic oscillator 30a may include an atomic oscillator using an electromagnetically induced transparency (EIT) phenomenon (may be also referred to as "a coherent population trapping (CPT) phenomenon), an atomic oscillator using an optical microwave double resonance phenomenon, and the like.

The atomic oscillator 30a is configured to enable fine adjustment of an oscillation frequency in accordance with an output voltage (control voltage) of the digital-analog conversion circuit 26a. As described above, the phase comparator 21a, the loop filter 22a, the divider 24a, and the digital-analog conversion circuit 26a cause the clock signal output by the atomic oscillator 30a to be completely synchronized with 1 PPS output by the GPS receiver 10. Because the single atomic oscillator 30a does not have flat frequency-temperature characteristics, the temperature sensor 40 which detects the temperature of the atomic oscillator 30a is disposed in the vicinity of the atomic oscillator 30a. The DSP 23 adds a correction value to the phase difference signal of the phase comparator 21a in accordance with a detected value (detected temperature) of the temperature sensor 40, and thus performs processing of temperature compensation on the frequency-temperature characteristics of the atomic oscillator 30a.

If, for example, a situation (also referred to as "hold-over" below) in which receiving of a satellite signal by the GPS receiver 10 is not possible, or a reception environment becomes worse occurs, accuracy of 1 PPS output by the GPS receiver 10 is deteriorated or the GPS receiver 10 stops an output of 1 PPS. In such a case, the processing unit 20 stops processing (synchronization processing of the PLL circuit 60a) of synchronizing the clock signal output by the atomic oscillator 30a, with 1 PPS output by the GPS receiver 10. Then, the processing unit 20 causes the atomic oscillator 30a to perform self-running and oscillation. If the atomic oscillator 30a performs self-running and oscillation, even when the accuracy of 1 PPS output by the GPS receiver 10 is deteriorated, the timing signal generation device 1 can cause the PLL circuit 60b (which will be described later) to synchronize the clock signal output by the oven-controlled crystal oscillator 30b, with 1 PPS which is obtained by self-running and oscillation of the atomic oscillator 30a, and has high frequency accuracy. Thus, the timing signal generation device 1 can output 1 PPS. As long as an oscillator to be used has long-term frequency stability higher than that of the oven-controlled crystal oscillator (second oscillator) 30b, even when a crystal oscillator such as an oven-controlled crystal oscillator (OCXO) of double ovens or a single oven, a voltage-controlled crystal oscillator (VCXO), and a crystal oscillation circuit with a temperature compensation circuit (TCXO) is used instead of the atomic oscillator 30a, it is possible to output 1 PPS having high frequency accuracy, by self-running and oscillation. In this case, it is preferable that a crystal oscillator used as the first oscillator performs aging processing, from a viewpoint of improving long-term frequency stability.

Temperature Sensor

The temperature sensor 40 has a function of detecting the temperature of the atomic oscillator 30a. The temperature sensor 40 includes a thermocouple, a thermistor, for example.

OCXO (Second Oscillator)

Although not illustrated, the oven-controlled crystal oscillator 30b includes a crystal resonator and a thermostatic oven which stores the crystal resonator. The oven-controlled crystal oscillator 30b is configured to adjust the temperature of the thermostatic oven and to maintain the temperature of the crystal resonator to be constant. Such an oven-controlled crystal oscillator 30b has excellent short-term frequency stability and excellent frequency-temperature characteristics. The configuration of the thermostatic oven is not particularly limited. For example, the thermostatic oven may be configured by one wall or may be configured by two walls (double ovens). The crystal resonator is not particularly limited, and various crystal resonators maybe used as the crystal resonator. For example, as the crystal resonator, an AT cut resonator, an ST cut resonator, and the like may be used. The timing signal generation device 1 also outputs the clock signal which is output by the oven-controlled crystal oscillator 30b and has a frequency of f.

The oven-controlled crystal oscillator 30b is, for example, a voltage-controlled oscillator. The oven-controlled crystal oscillator 30b is configured to enable fine adjustment of an oscillation frequency in accordance with an output voltage (control voltage) of the digital-analog conversion circuit 26b. As described above, the phase comparator 21b, the loop filter 22b, the divider 24b, and the digital-analog conversion circuit 26b cause the clock signal output by the oven-controlled crystal oscillator 30b to be completely synchronized with the division clock signal (1 PPS) output by the divider 24a of the PLL circuit 60a.

As will be described later, when a situation is changed from hold-over to a situation in which the GPS receiver 10 can receive a satellite signal (also referred to as "GPS reset" below), and the synchronization processing of the PLL circuit 60a is restarted, generally, the processing unit 20 stops processing (synchronization processing of the PLL circuit 60b) of synchronizing the clock signal output by the oven-controlled crystal oscillator 30b, with the division clock signal (1 PPS) output by the phase comparator 21a. Then, the processing unit 20 may cause the oven-controlled crystal oscillator 30b to perform self-running and oscillation. As long as an oscillator to be used has short-term frequency stability higher than that of the above-described atomic oscillator (first oscillator) 30a, a crystal oscillator such as a voltage-controlled crystal oscillator (VCXO) and a crystal oscillation circuit with a temperature compensation circuit (TCXO) may be used instead of the oven-controlled crystal oscillator 30b.

Hitherto, the entirety of the configuration of the timing signal generation device 1 is described. The control of the PLL circuits 60a and 60b will be described below in detail.

Control System of First Synchronization Unit and Second Synchronization Unit

Figure 3:
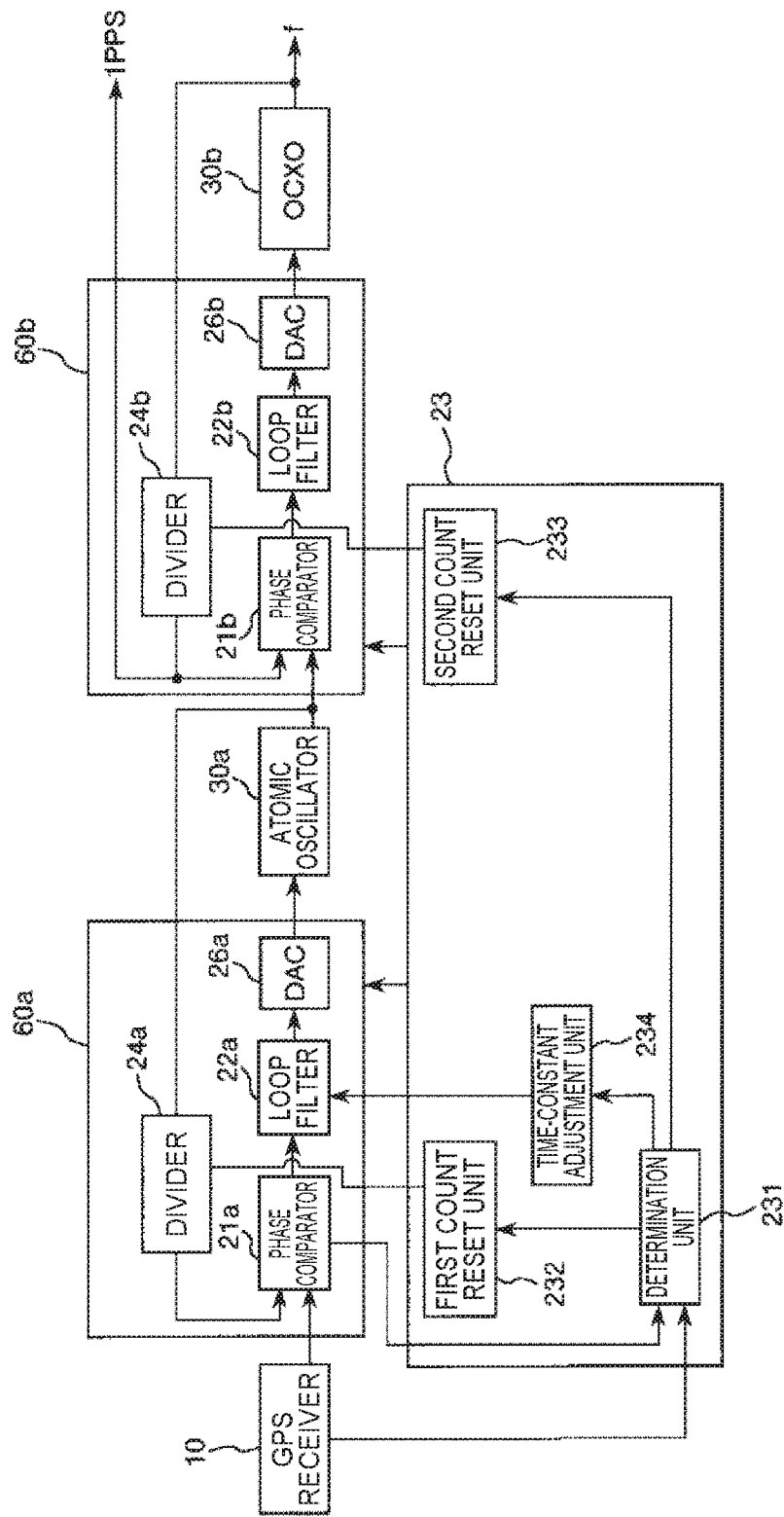
FIG. 3 is a block diagram illustrating a control system of a first synchronization unit and a second synchronization unit in the timing signal generation device illustrated in FIG. 1.

FIG. 3 is a block diagram illustrating a control system of the first synchronization unit and the second synchronization unit in the timing signal generation device illustrated in FIG. 1.

The DSP 23 has a function of controlling the PLL circuit (first synchronization unit) 60a and the PLL circuit (second synchronization unit) 60b. In particular, the DSP 23 has a function of performing switching between a state of operating the PLL circuit 60a, and a state of stopping the PLL circuit 60a, in accordance with a reception state of the GPS receiver (reference timing signal output unit) 10. Thus, when hold-over occurs, the PLL circuit 60a may be stopped, and the atomic oscillator (first oscillator) 30a may be caused to perform self-running and oscillation. When a situation is changed from hold-over to the situation in which the GPS receiver 10 can receive a satellite signal (in GPS reset), an operation of the PLL circuit 60a is restarted, and thus the clock signal output by the atomic oscillator 30a may be synchronized with 1 PPS output by the GPS receiver 10.

The DSP 23 has a function of performing switching between a state of operating the PLL circuit 60b and a state of stopping the PLL circuit 60b, if necessary.

Here, each of the divider 24a of the PLL circuit 60a and the divider 24b of the PLL circuit 60b is configured to enable forceful resetting of the count value (separate from the original reset operation in accordance with the count). The DSP 23 has a function of resetting each of the PLL circuits 60a and 60b based on the reception status of the GPS receiver 10 and a comparison result of the phase comparator 21a.

The time constant of the loop filter 22a in the PLL circuit 60a varies. Thus, the DSP 23 has a function of adjusting the time constant of the PLL circuit 60a based on the reception status of the GPS receiver 10 and the comparison result of the phase comparator 21a.

Such a DSP 23 includes a determination unit 231, a first count reset unit 232, a second count reset unit 233, and a time-constant adjustment unit 234. The determination unit 231 performs determination based on the reception status of the GPS receiver 10 and the comparison result of the phase comparator 21a. The first count reset unit 232 resets the count value of the divider 24a. The second count reset unit 233 resets the count value of the divider 24b. The time-constant adjustment unit 234 adjusts the time constant of the loop filter 22a.

The determination unit 231 has a function of determining whether or not the GPS receiver 10 is in a hold-over state, based on the reception status of the GPS receiver 10. The determination unit 231 has a function of determining whether or not the phase difference between the first division clock signal and the reference timing signal is equal to or less than a setting value (first setting value), based on the comparison result of the phase comparator 21a. Further, the determination unit 231 has a function of determining whether or not the phase difference between the first division clock signal and the reference timing signal when switching is performed from the state of stopping the PLL circuit 60a to the state of operating the PLL circuit 60a is equal to or more than a setting value (second setting value), based on the reception status of the GPS receiver 10 and the comparison result of the phase comparator 21a.

The first count reset unit 232 has a function of resetting the count value of the divider 24a, based on the determination result of the determination unit 231. The first count reset unit 232 is configured to enable resetting of the count value of the divider 24a when switching is performed from the state of stopping the PLL circuit 60a to the state of operating the PLL circuit 60a (in GPS reset). In the embodiment, the first count reset unit 232 is configured to perform resetting when the phase difference between the first division clock signal and the reference timing signal when switching is performed from the state of stopping the PLL circuit 60a to the state of operating the PLL circuit 60a is equal to or more than the setting value.

The second count reset unit 233 has a function of resetting the count value of the divider 24b, based on the determination result of the determination unit 231. The second count reset unit 233 is configured to enable resetting of the count value of the divider 24b when switching is performed from the state of stopping the PLL circuit 60a to the state of operating the PLL circuit 60a (in GPS reset). In the embodiment, the second count reset unit 233 is configured to perform resetting when the phase difference between the first division clock signal and the reference timing signal when switching is performed from the state of stopping the PLL circuit 60a to the state of operating the PLL circuit 60a is equal to or more than the setting value. In particular, the second count reset unit 233 is configured to reset the count value of the divider 24b after the first count reset unit 232 resets the count value of the divider 24a.

The time-constant adjustment unit (first time-constant adjustment unit) 234 has a function of adjusting the time constant of the loop filter 22a, based on the determination result of the determination unit 231. The time-constant adjustment unit 234 is configured to reduce the time constant of the loop filter 22a when the phase difference between the first division clock signal and the reference timing signal is equal to or less than the setting value after the first count reset unit 232 resets the count value of the divider 24a, and then the time constant of the loop filter 22a is reduced.

Switching of the PLL circuit 60a between an operation and stop performed by the DSP 23 will be described below.

Figure 4:
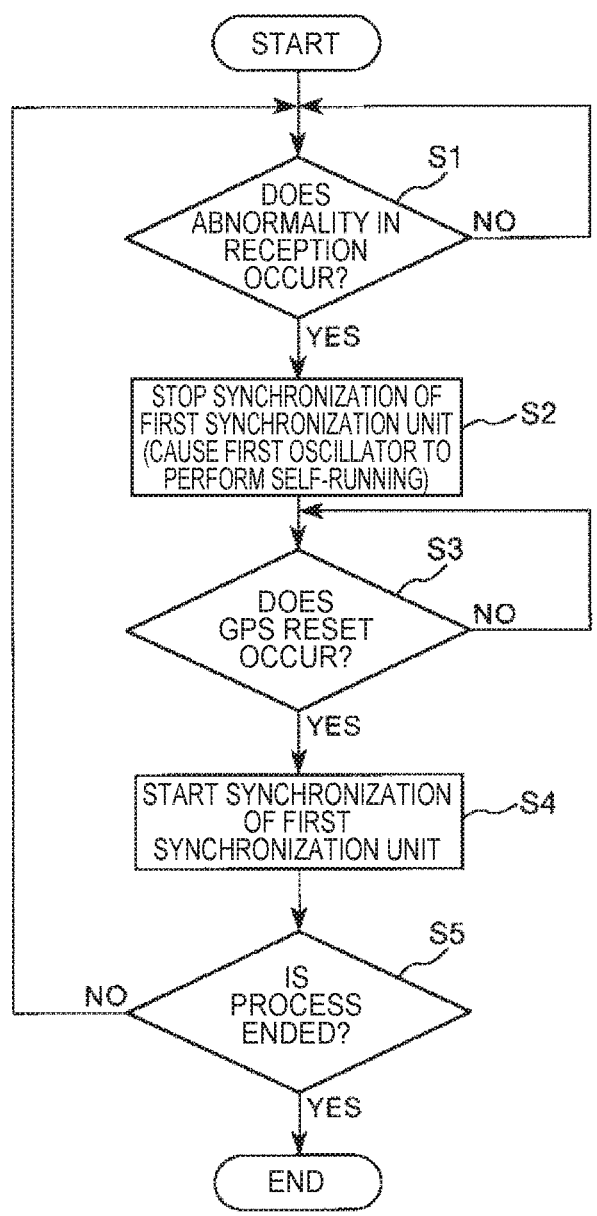
FIG. 4 is a flowchart illustrating switching between synchronization and stop of the first synchronization unit in the timing signal generation device illustrated in FIG. 1.

FIG. 4 is a flowchart illustrating switching of the first synchronization unit between synchronization and stop, in the timing signal generation device illustrated in FIG. 1.

Firstly, the determination unit 231 determines whether or not abnormality in reception (hold-over) occurs, based on the reception status of the GPS receiver 10 (Step S1). The process of Step S1 is repeated (NO in Step S1) until it is determined that abnormality in reception occurs. In a case where it is determined that abnormality in reception occurs (YES in Step S1), an operation of the PLL circuit 60a is stopped (Step S2). At this time, the atomic oscillator 30a is caused to perform self-running and oscillation. Thus, the PLL circuit 60a is assumed to synchronize the second division clock signal with a first division clock obtained by self-running and oscillation of the atomic oscillator 30a, and to output a signal obtained by the synchronization as a timing signal to the outside of the circuit 60a.

Then, the determination unit 231 determines whether or not a state of GPS reset occurs, based on the reception status of the GPS receiver 10 (Step S3). The process of Step S3 is repeated (NO in Step S3) until it is determined that the state of GPS reset occurs. In a case where it is determined that the state of GPS reset occurs (YES in Step S3), the operation of the PLL circuit 60a is started (restarted) (Step S4).

It is determined whether or not the process is to be ended (Step S5). In a case where an end instruction is not received (NO in Step S5), the process proceeds to the above-described process of Step S1. In a case where the end instruction is received (YES in Step S5), the process is ended.

In the above-described manner, switching between an operation and stop of the PLL circuit 60a is performed by the DSP 23. Here, in the above-described process of Step S4, the PLL circuits 60a and 60b are controlled in the above-described manner.

Figure 5:
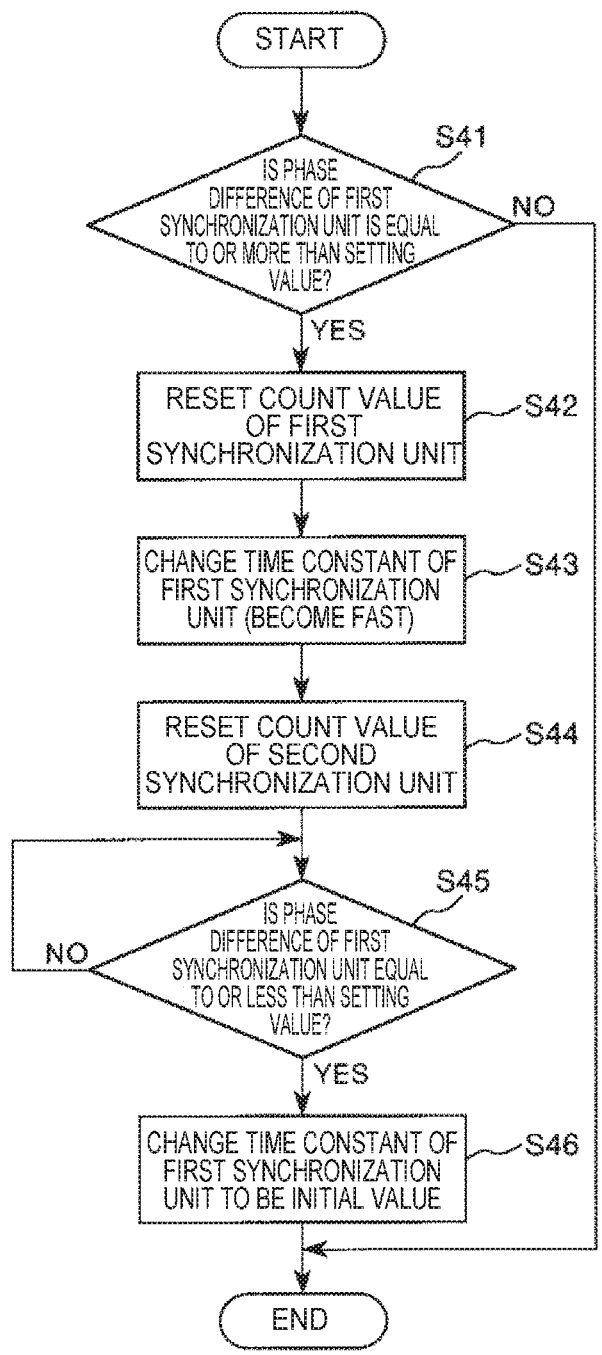
FIG. 5 is a flowchart illustrating an operation of the first synchronization unit and the second synchronization unit when synchronization is started, in the timing signal generation device illustrated in FIG. 1.

FIG. 5 is a flowchart illustrating an operation of the first synchronization unit and the second synchronization unit when synchronization is started, in the timing signal generation device illustrated in FIG. 1.

Firstly, the determination unit 231 determines whether or not the phase difference between the first division clock signal and the reference timing signal when switching is performed from the state of stopping the PLL circuit 60a to the state of operating the PLL circuit 60a is equal to or more than the setting value (second setting value), based on the reception status of the GPS receiver 10 and the comparison result of the phase comparator 21a (Step S41). Here, as will be described later, because the phase difference between the first division clock signal and the reference timing signal after the count value of the divider 24a is reset is set to be equal to or less than 100 ns, in a case where the frequency of the first clock signal is 10 MHz, the setting value (second setting value) in Step S41 is preferably equal to or more than 100 ns.

In a case where the phase difference is less than the setting value (NO in Step S41), the operation of the PLL circuit 60a is started (restarted) with an initial value itself, without resetting the count values of the dividers 24a and 24b, or changing the time constant of the loop filter 22a. The initial value of the time constant of the loop filter 22a is preferably equal to or more than 1000 seconds. Thus, it is possible to reduce an occurrence of a situation in which the first division clock signal is influenced by the fluctuation of the reference timing signal when the first division clock signal is synchronized with the reference timing signal.

In a case where the phase difference is equal to or more than the setting value (YES in Step S41), firstly, the first count reset unit 232 resets the count value of the divider 24a (Step S42). At this time, synchronization of the PLL circuit 60b is stopped and the oven-controlled crystal oscillator 30b is caused to perform self-running and oscillation.

Then, the time-constant adjustment unit 234 reduces the time constant of the loop filter 22a (Step S43). The time constant of the loop filter 22a after being adjusted in Step S43 may be smaller than the initial value, but is preferably more than the time constant of the loop filter 22b. More specifically, the time constant of the loop filter 22a after being adjusted is preferably from 10 seconds to 1000 seconds. Thus, it is possible to reduce the frequency fluctuation of the first division clock signal and to rapidly synchronize the first division clock signal and the reference timing signal with each other. The time constant of the loop filter 22b is preferably smaller than the time constant of the loop filter 22a. More specifically, the time constant of the loop filter 22b is preferably from 5 seconds to 100 seconds. Thus, it is possible to reduce the frequency fluctuation of the second division clock signal and to rapidly synchronize the first division clock signal and the second division clock signal with each other.

Then, the second count reset unit 233 resets the count value of the divider 24b (Step S44). At this time, synchronization of the PLL circuit 60b is restarted. Thus, the synchronization of the PLL circuit 60b is stopped and the oven-controlled crystal oscillator 30b is caused to perform self-running and oscillation, during a period from resetting of the count value of the divider 24a until resetting of the count value of the divider 24b.

Then, the determination unit 231 determines whether or not the phase difference between the first division clock signal and the reference timing signal is equal to or less than the setting value (first setting value), based on the comparison result of the phase comparator 21a (Step S45). The setting value (first setting value) in Step S45 is preferably equal to or less than 100 ns, and more preferably equal to or less than 50 ns.

The process of Step S45 is repeated (NO in Step S45) until the phase difference is equal to or less than the setting value. In a case where the phase difference is equal to or less than the setting value, the time-constant adjustment unit 234 increases the time constant of the loop filter 22a so as to have, for example, the initial value (Step S46). As described above, the operations of the PLL circuits 60a and 60b are started, and the process proceeds to the above-described process of Step S5 in a state of maintaining the operation state.

In the above-described manner, the PLL circuits 60a and 60b perform an operation in GPS reset. Reset timings of the reference timing signal, the first clock signal, the first division clock signal, and the first count reset unit, and a timing of the count value of the first divider will be described below.

Figure 6:
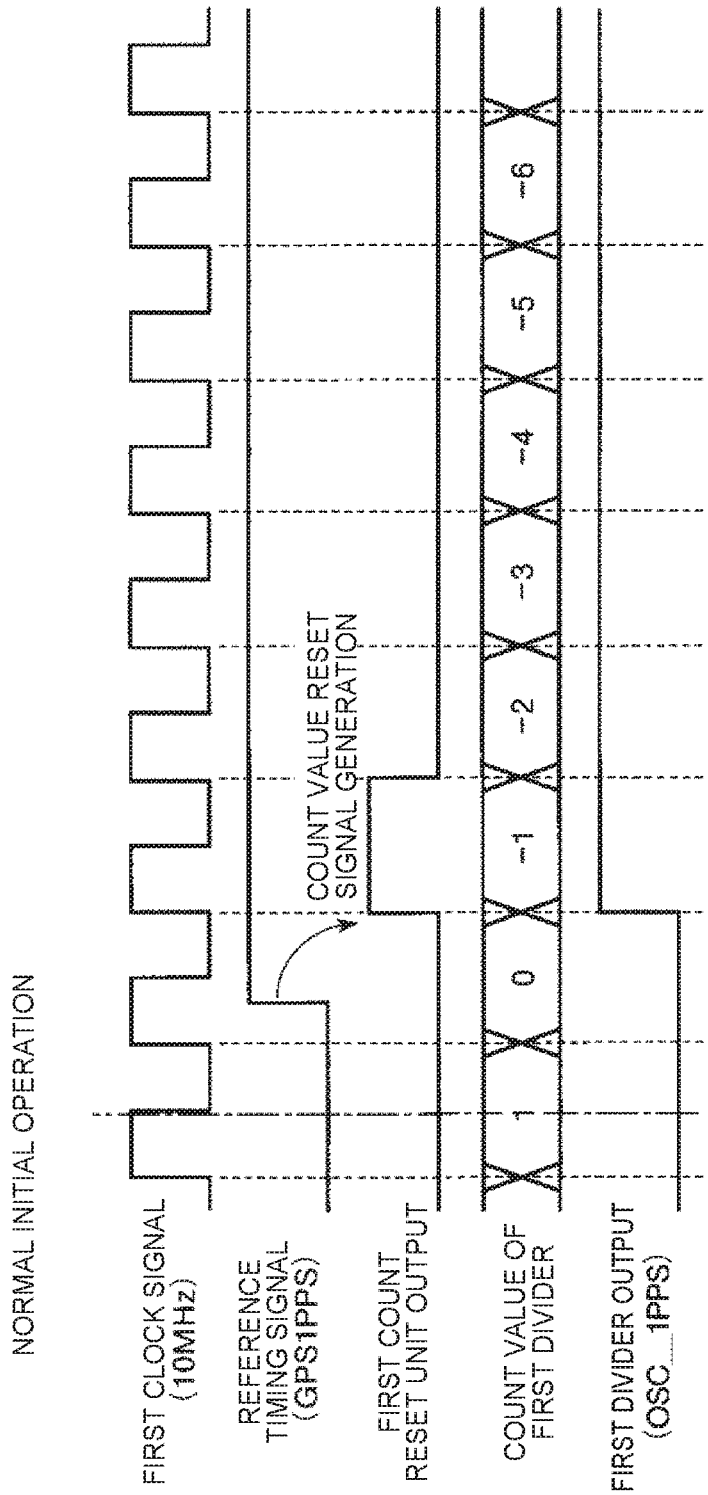
FIG. 6 is a timing chart illustrating an initial operation of the first synchronization unit in the timing signal generation device illustrated in FIG. 1.

FIG. 6 is a timing chart illustrating an initial operation of the first synchronization unit in the timing signal generation device illustrated in FIG. 1.

In the normal initial operation of the timing signal generation device 1, as illustrated in FIG. 6, power is applied to the timing signal generation device 1, the GPS receiver 10 is in a situation of enabling receiving of a satellite signal, and a reference timing signal is output. If the above operations are performed, a rising timing of the reference timing signal is used as a trigger, and synchronization with rising or falling of a pulse of the first clock signal just after the reference timing signal is performed. The first count reset unit 232 outputs a reset signal, and the count value of the divider 24a is reset by the reset signal. The divider 24a repeats an operation in which pulses of the first clock signal corresponding to one second are counted, and resetting is performed. Then, the divider 24a outputs a division clock signal of 1 PPS. FIG. 6 illustrates an example in which the divider 24a repeats an operation of counting down for pulses of the first clock signal corresponding to 0.5 seconds, and then counting up for pulses corresponding to 0.5 seconds.

Here, the first count reset unit 232 outputs the reset signal with synchronization with rising or falling of a pulse of the first clock signal just after the reference timing signal. Thus, in a case where the frequency of the first clock signal is 10 MHz, that is, in a case where a pulse interval of the first clock signal is 100 ns, the phase difference between the first division clock signal and the reference timing signal after the count value of the divider 24a is reset is equal to or less than 100 ns.

Figure 7:
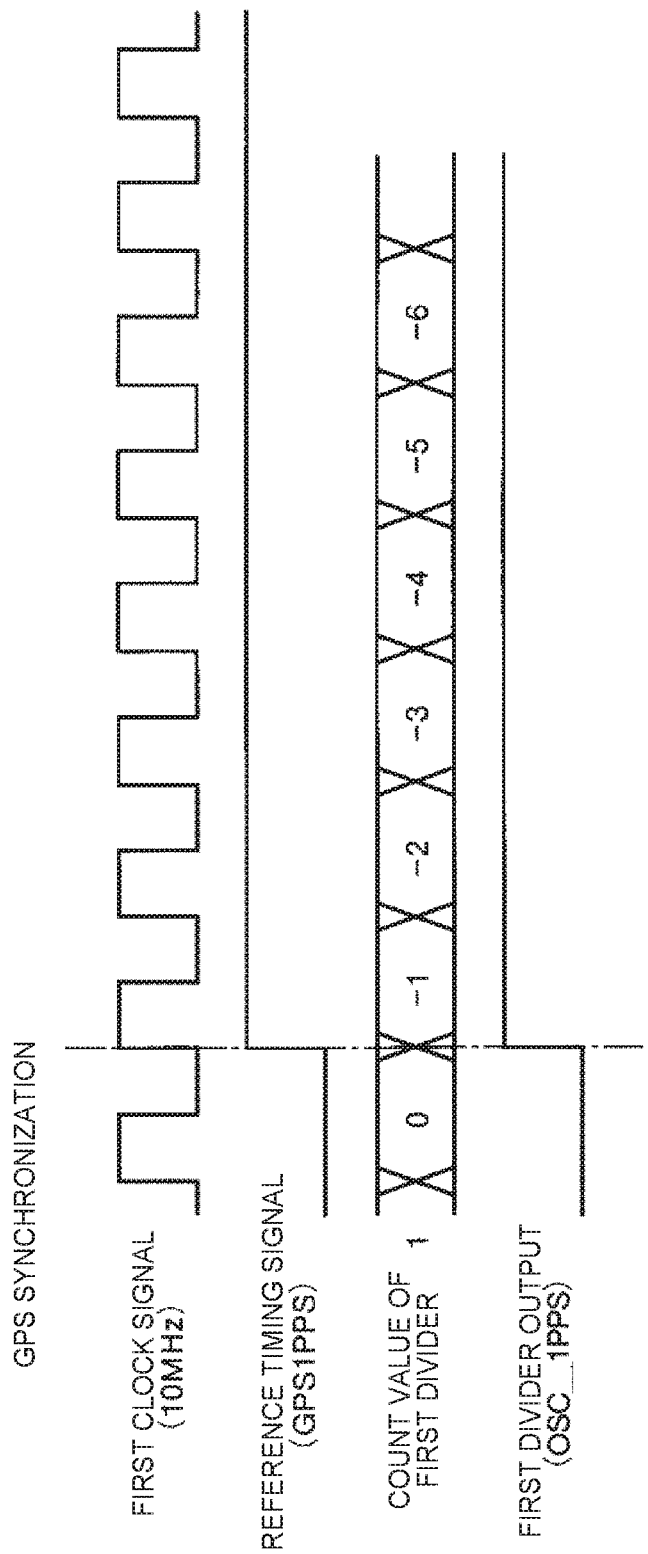
FIG. 7 is a timing chart illustrating an operation of the first synchronization unit in synchronization (in GPS synchronization), in the timing signal generation device illustrated in FIG. 1.

FIG. 7 is a timing chart illustrating an operation of the first synchronization unit during synchronization (during GPS synchronization), in the timing signal generation device illustrated in FIG. 1.

As described above, after an operation of the PLL circuit 60a is started, an action of the PLL circuit 60a causes the reference timing signal and the first division clock signal to be synchronized with each other (this time is also referred to as "GPS synchronization"), as illustrated in FIG. 7.

Figure 8:
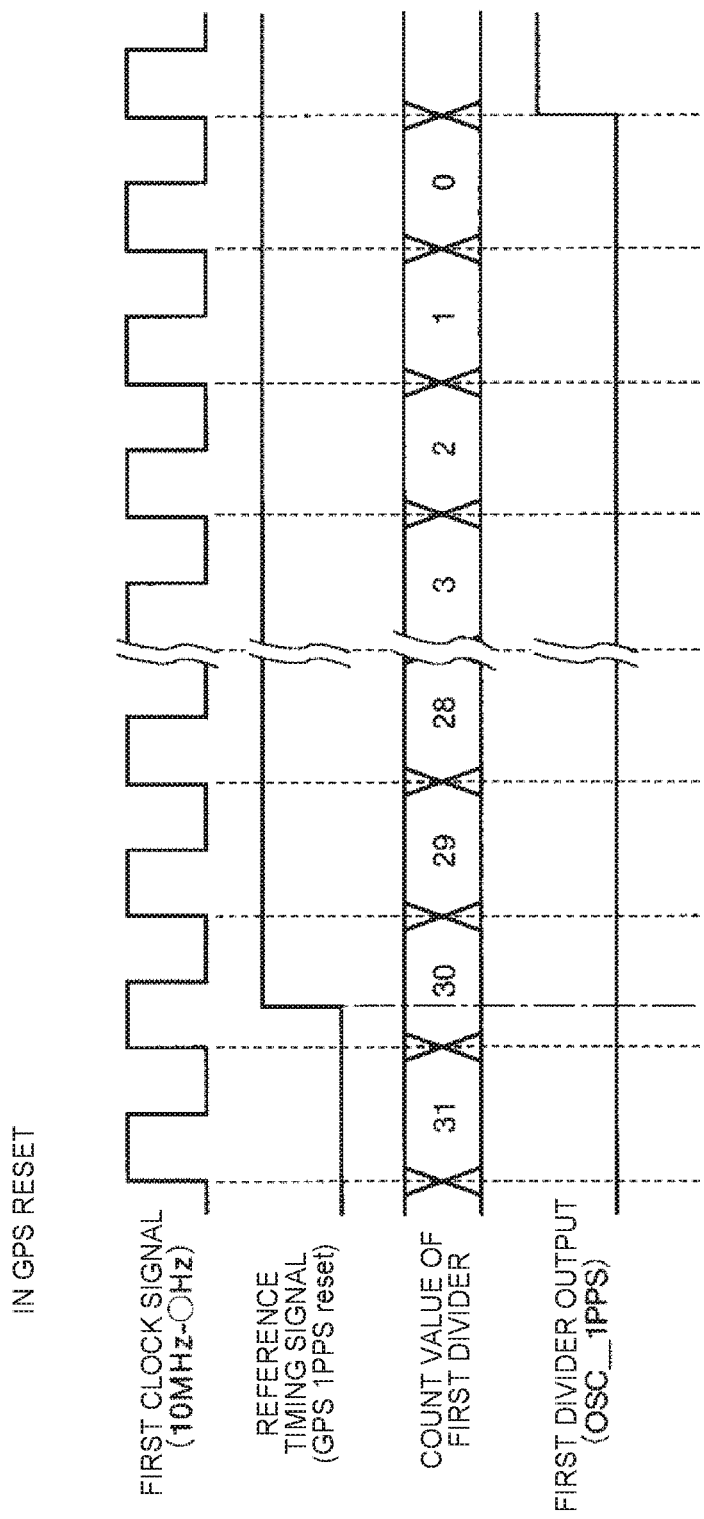
FIG. 8 is a timing chart illustrating an operation of the first synchronization unit when synchronization is restarted (in GPS reset), in the timing signal generation device illustrated in FIG. 1.

FIG. 8 is a timing chart illustrating an operation of the first synchronization unit when synchronization is restarted (in GPS reset), in the timing signal generation device illustrated in FIG. 1.

When GPS reset is performed from hold-over, as illustrated in FIG. 8, a phase difference between the reference timing signal and the first division clock signal occurs.

Figure 9:
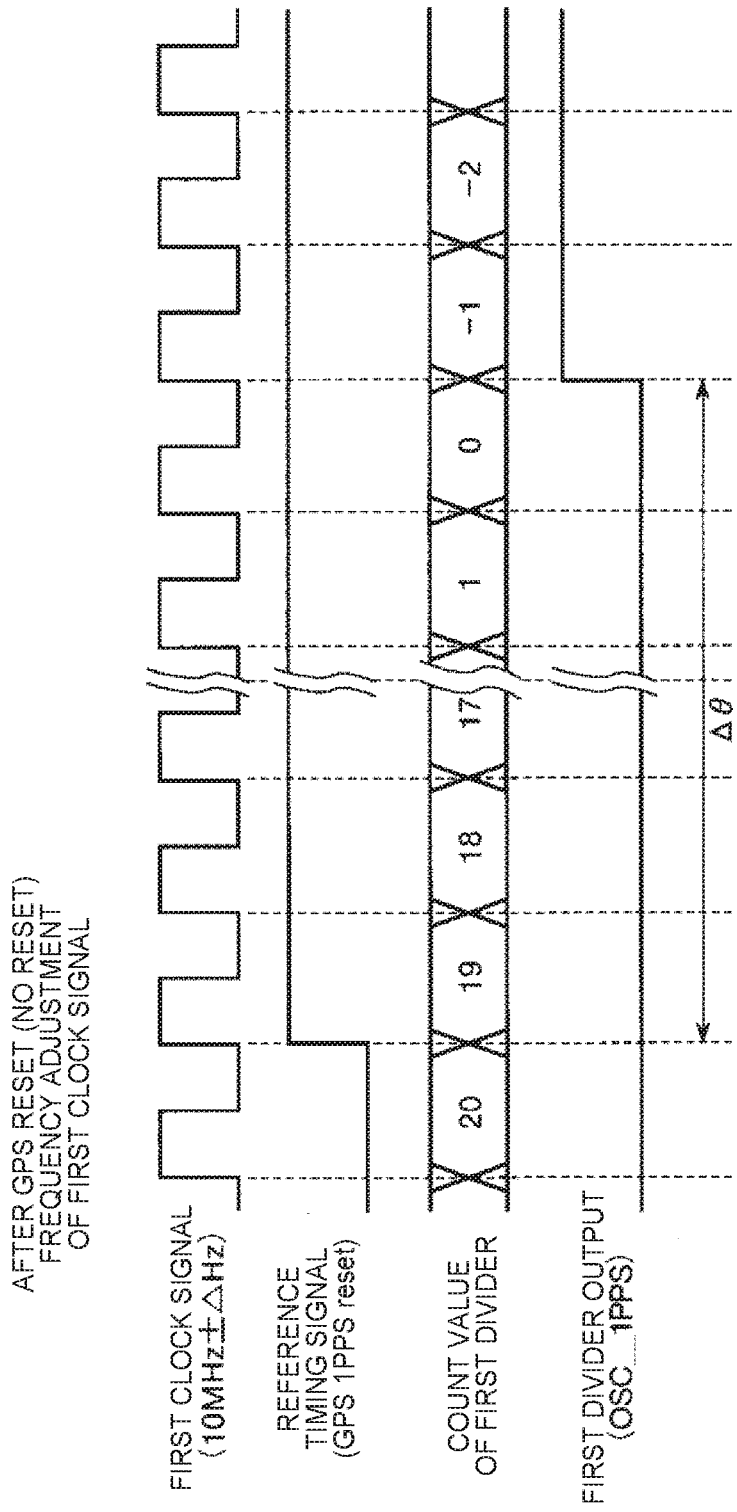
FIG. 9 is a timing chart illustrating an operation of the first synchronization unit after the synchronization is restarted, in a case where resetting is not performed.

FIG. 9 is a timing chart illustrating an operation of the first synchronization unit after the synchronization is restarted, in a case where resetting is not performed.

When the phase difference between the reference timing signal and the first division clock signal when GPS reset is performed from hold-over is large, if the dividers 24a and 24b are not reset, the timing of the first division clock signal is required to be adjusted by the large phase difference Δθ, as illustrated in FIG. 9. Thus, it takes a long time to complete synchronization between the reference timing signal and the first division clock signal. If the synchronization between the reference timing signal and the first division clock signal is completed early, in a case where simply the time constant of the loop filter 22a is reduced, the frequency of the first division clock signal fluctuates largely. As described above, when the phase difference between the reference timing signal and the first division clock signal when GPS reset is performed from hold-over is large, the dividers 24a and 24b are reset.

Figure 10:
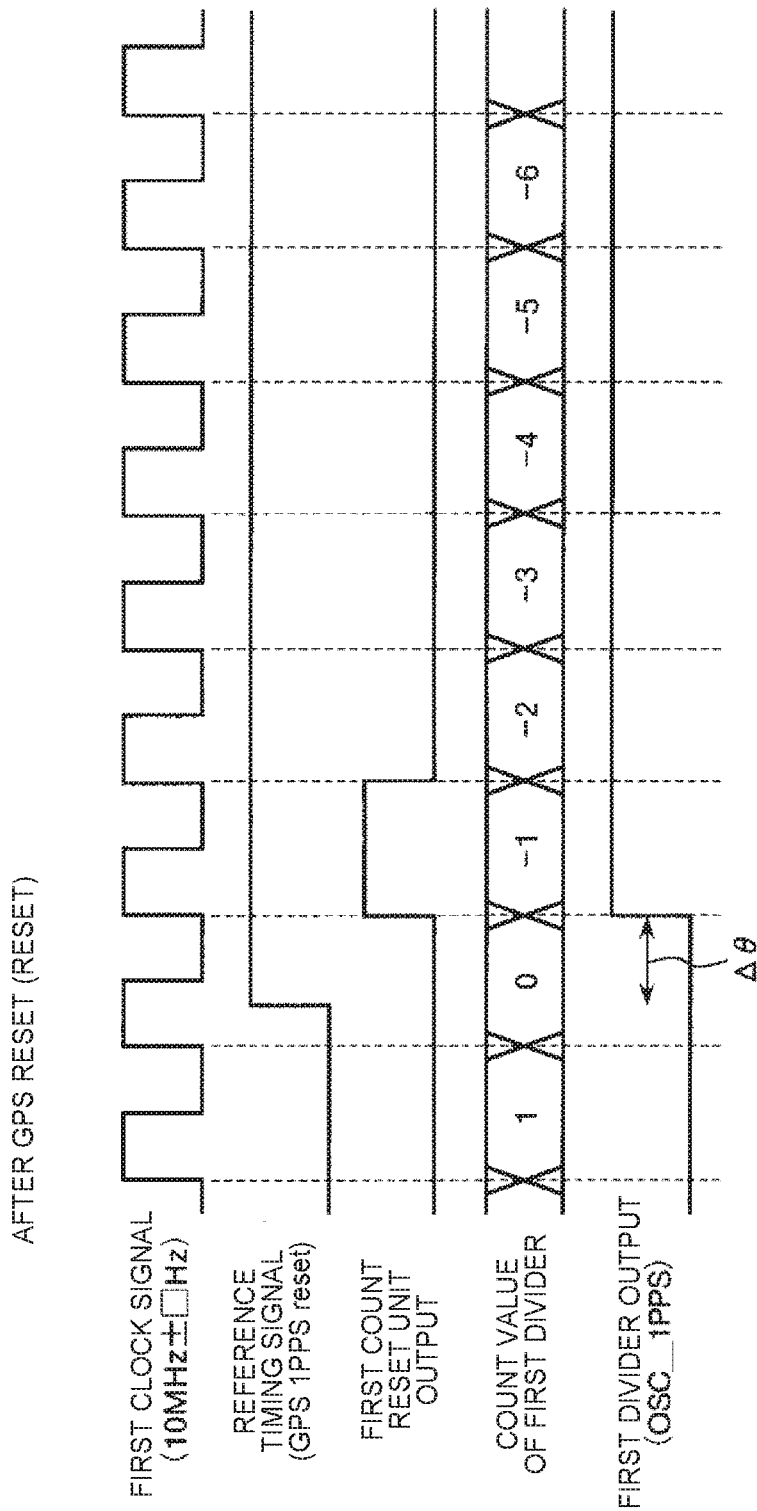
FIG. 10 is a timing chart illustrating an operation of the first synchronization unit when the synchronization is restarted, in the timing signal generation device illustrated in FIG. 1.

FIG. 10 is a timing chart illustrating an operation of the first synchronization unit when the synchronization is restarted, in the timing signal generation device illustrated in FIG. 1.

As illustrated in FIG. 10, if the dividers 24a and 24b are reset when the phase difference between the reference timing signal and the first division clock signal when GPS reset is performed from hold-over is large, the timing of the first division clock signal may be adjusted by the small phase difference Δθ. Thus, it is possible to reduce a time required until synchronization between the reference timing signal and the first division clock signal is completed. Since the phase difference Δθ to be adjusted is small, even when the time constant of the loop filter 22a is set to be small, it is possible to reduce fluctuation of the frequency of the first division clock signal and to complete synchronization between the reference timing signal and the first division clock signal early.

Here, an amount of the frequency fluctuation of the atomic oscillator 30a in hold-over is about $10^{-11}$ to $10^{-12}$ per day. Thus, even when the count value of the divider 24a is reset, the first division clock signal has substantially the same frequency as that of the reference timing signal and has a phase shifted from the reference timing signal. Thus, even when the count value of the divider 24a is reset, it is possible to reduce an influence of the timing signal generation device 1 on a system.

According to the above-described timing signal generation device 1, when the state is switched from the state of stopping the PLL circuit 60a to the state of operating the PLL circuit 60a (for example, when switching is performed from a state when hold-over occurs to a state when a GPS is reset), the first count reset unit 232 resets the count value of the divider 24a, and thus it is possible to reduce a phase difference and fluctuation thereof between the reference timing signal and the first division clock signal. Simultaneously with reset of the count value of the divider 24a or after the reset, the second count reset unit 233 resets the count value of the divider 24b, and thus it is possible to also reduce a phase difference between the reference timing signal, and the first division clock signal and the second division clock signal. Accordingly, in the timing signal generation device 1, the second division clock signal is output as the timing signal, and thus, it is possible to reduce frequency fluctuation of a timing signal to be output, and to rapidly synchronize the timing signal and a reference timing signal with each other, when synchronization with the reference timing signal is restarted.

In the embodiment, each of the first count reset unit 232 and the second count reset unit 233 is reset when the phase difference between the first division clock signal and the reference timing signal when switching is performed from the state of stopping the PLL circuit 60a to the state of operating the PLL circuit 60a is equal to or more than the setting value. Thus, an effect obtained by resetting the count values of the dividers 24a and 24b (that is, an effect of reducing fluctuation of the timing signal when switching is performed from the state of stopping the PLL circuit 60a to the state of operating the PLL circuit 60a) is significantly shown.

Since the second count reset unit 233 resets the count value of the divider 24b after the first count reset unit 232 resets the count value of the divider 24a, it is possible to reduce an influence of fluctuation of the first division clock signal and to synchronize the first division clock signal and the second division clock signal with each other. The oven-controlled crystal oscillator 30b performs self-running and oscillation for a period until the count values of both of the dividers 24a and 24b are reset. Thus, it is possible to output the second division clock signal as a timing signal with relatively high accuracy.

The first count reset unit 232 resets the count value of the divider 24a, and then the time-constant adjustment unit 234 reduces the time constant of the loop filter 22a. Thus, it is possible to rapidly synchronize the first division clock signal and the reference timing signal with each other when switching is performed from the state of stopping the PLL circuit 60a to the state of operating the PLL circuit 60a. At this time, the first count reset unit 232 resets the count value of the divider 24a, and thus the phase difference between the reference timing signal and the first division clock signal is reduced. Accordingly, even when the time constant of the divider 24a is reduced, it is possible to reduce fluctuation of the first division clock signal.

In the embodiment, the time constant of the loop filter 22a is increased when the phase difference between the first division clock signal and the reference timing signal is equal to or less than the setting value after the first time-constant adjustment unit 234 reduces the time constant of the loop filter 22a. Thus, it is possible to reduce the fluctuation of the first division clock signal.

Since the time constant of the loop filter 22a is more than the time constant of the loop filter 22b, it is possible to obtain excellent responsiveness of the PLL circuit 60b, and to reduce an occurrence of a situation in which the first division clock signal is influenced by the fluctuation of the reference timing signal.

Since the long term stability of the atomic oscillator 30a is higher than the long term stability of the oven-controlled crystal oscillator 30b, it is possible to obtain excellent long-term frequency stability and short-term frequency stability of the timing signal generation device 1 when the atomic oscillator 30a is caused to perform self-running and oscillation. In particular, it is possible to obtain very excellent long-term frequency stability of the timing signal generation device 1 when the atomic oscillator 30a is caused to perform self-running and oscillation. The oven-controlled crystal oscillator 30b is used in a combination with the atomic oscillator 30a, and thus it is possible to obtain very excellent short-term frequency stability of the timing signal generation device 1 when the atomic oscillator 30a is caused to perform self-running and oscillation.

Second Embodiment

Figure 11:
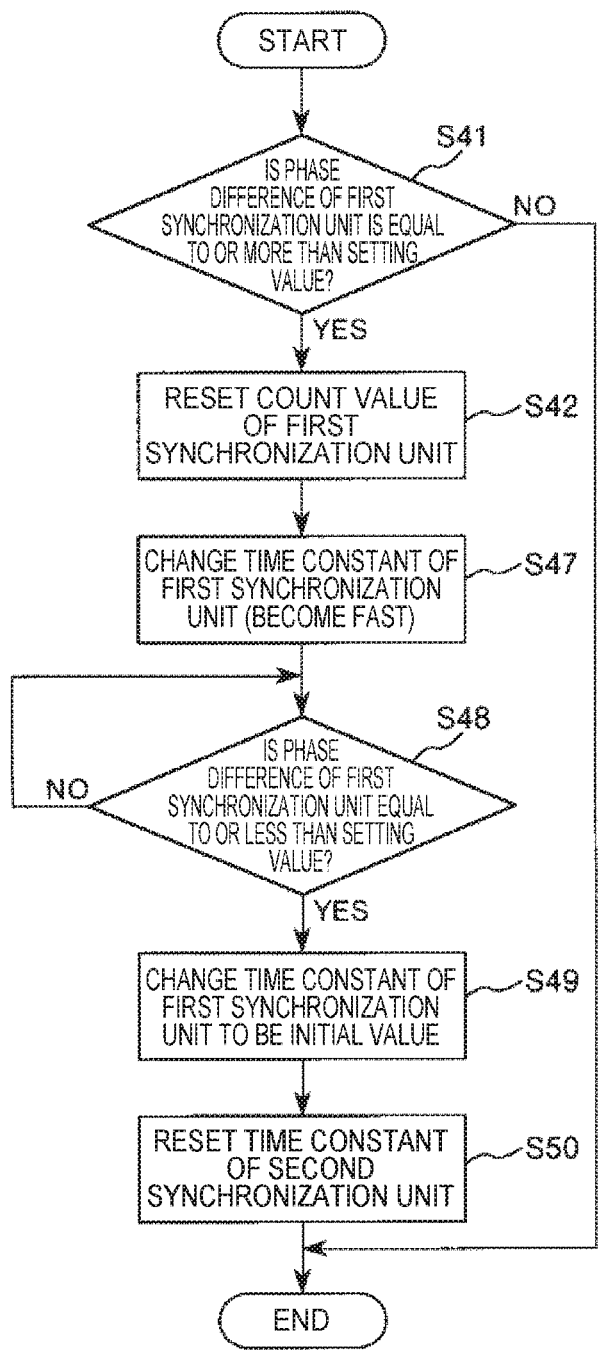
FIG. 11 is a flowchart illustrating an operation of a first synchronization unit when synchronization is started, in a timing signal generation device according to a second embodiment of the invention.

FIG. 11 is a flowchart illustrating an operation of a first synchronization unit when synchronization is started, in a timing signal generation device according to a second embodiment of the invention.

This embodiment is similar to the above-described first embodiment except for different control of the second synchronization unit in GPS reset.

In the following descriptions, descriptions relating to the second embodiment will be made focused on different points from the above-described embodiment, and descriptions for similar items will be omitted. In FIG. 11, components similar to those in the above-described embodiment are denoted by the same reference signs.

In this embodiment, firstly, the processes of Steps S41 and S42 are performed similarly to the above-described first embodiment. Then, the time-constant adjustment unit 234 reduces the time constant of the loop filter 22a (Step S47).

Then, the determination unit 231 determines whether or not the phase difference between the first division clock signal and the reference timing signal is equal to or less than the setting value (first setting value), based on the comparison result of the phase comparator 21a (Step S48). The process of Step S48 is repeated (NO in Step S48) until the phase difference is equal to or less than the setting value. In a case where the phase difference is equal to or less than the setting value, the time-constant adjustment unit 234 increases the time constant of the loop filter 22a so as to have, for example, the initial value (Step S49).

Then, the second count reset unit 233 resets the count value of the divider 24b (Step S50). At this time, synchronization of the PLL circuit 60b is restarted.

As described above, the second count reset unit 233 resets the count value of the divider 24b when the phase difference between the first division clock signal and the reference timing signal is equal to or less than the setting value. Thus, it is possible to accurately reduce an influence of fluctuation of the first division clock signal, and to synchronize the first division clock signal and the second division clock signal with each other.

Third Embodiment

Figure 12:
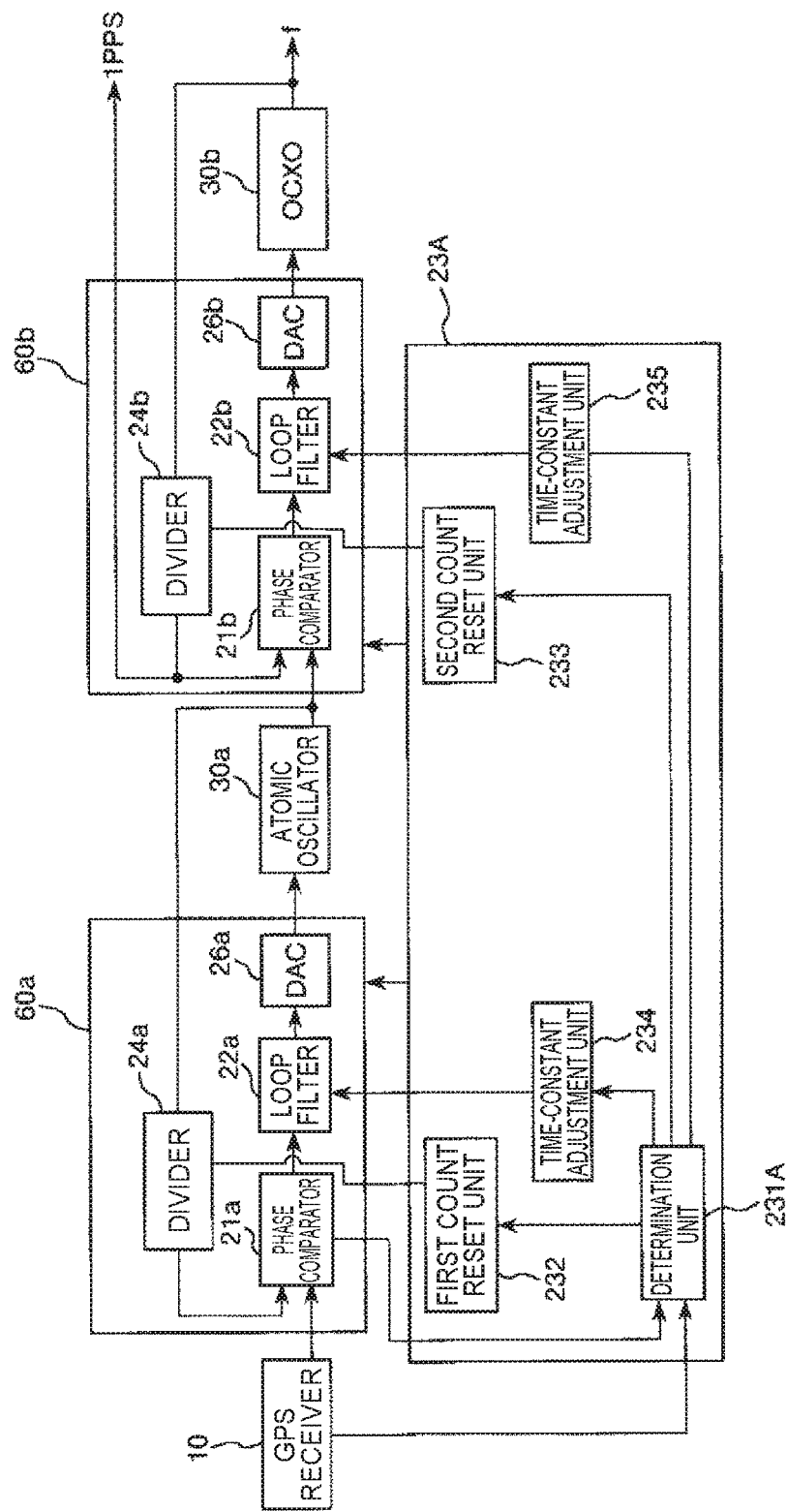
FIG. 12 is a block diagram illustrating a control system of a first synchronization unit and a second synchronization unit in a timing signal generation device according to a third embodiment of the invention.

FIG. 12 is a block diagram illustrating a control system of a first synchronization unit and a second synchronization unit in a timing signal generation device according to a third embodiment of the invention.

This embodiment is similar to the above-described first embodiment except that the time constant of the second loop filter can be adjusted.

In the following descriptions, descriptions relating to the third embodiment will be made focused on different points from the above-described embodiment, and descriptions for similar items will be omitted. In FIG. 12, components similar to those in the above-described embodiment are denoted by the same reference signs.

A DSP 23A according to this embodiment includes a determination unit 231A, a first count reset unit 232, a second count reset unit 233, a time-constant adjustment unit 234, and a time-constant adjustment unit (second time-constant adjustment unit) 235. The determination unit 231A performs determination based on the reception status of the GPS receiver 10 and the comparison result of the phase comparator 21a. The first count reset unit 232 resets the count value of the divider 24a. The second count reset unit 233 resets the count value of the divider 24b. The time-constant adjustment unit 234 adjusts the time constant of the loop filter 22a. The time-constant adjustment unit 235 adjusts the time constant of the loop filter 22b.

The time-constant adjustment unit 235 has a function of reducing the time constant of the loop filter 22b when the second count reset unit 233 resets the count value of the divider 24b, based on the determination result of the determination unit 231A. Thus, it is possible to rapidly synchronize the first division clock signal and the second division clock signal with each other when switching is performed from the state of stopping the PLL circuit 60a to the state of operating the PLL circuit 60a. At this time, the second count reset unit 233 resets the count value of the divider 24b, and thus the phase difference between the first division clock signal and the second division clock signal is reduced. Accordingly, even when the time constant of the divider 24b is reduced, it is possible to reduce fluctuation of the second division clock signal.

In this manner, a predetermined period elapses after the time constant of the loop filter 22b is reduced, and then the time-constant adjustment unit 234 increases the time constant of the loop filter 22a so as to have, for example, the initial value. For example, the determination unit 231A determines whether or not the phase difference between the first division clock signal and the second division clock signal is equal to or less than a setting value (third setting value), based on the comparison result of the phase comparator 21b. In a case where the phase difference is equal to or less than the setting value, the time-constant adjustment unit 235 increases the time constant of the loop filter 22b so as to have, for example, the initial value.

2. Electronic Device

Next, an embodiment of an electronic device according to the invention will be described.

Figure 13:
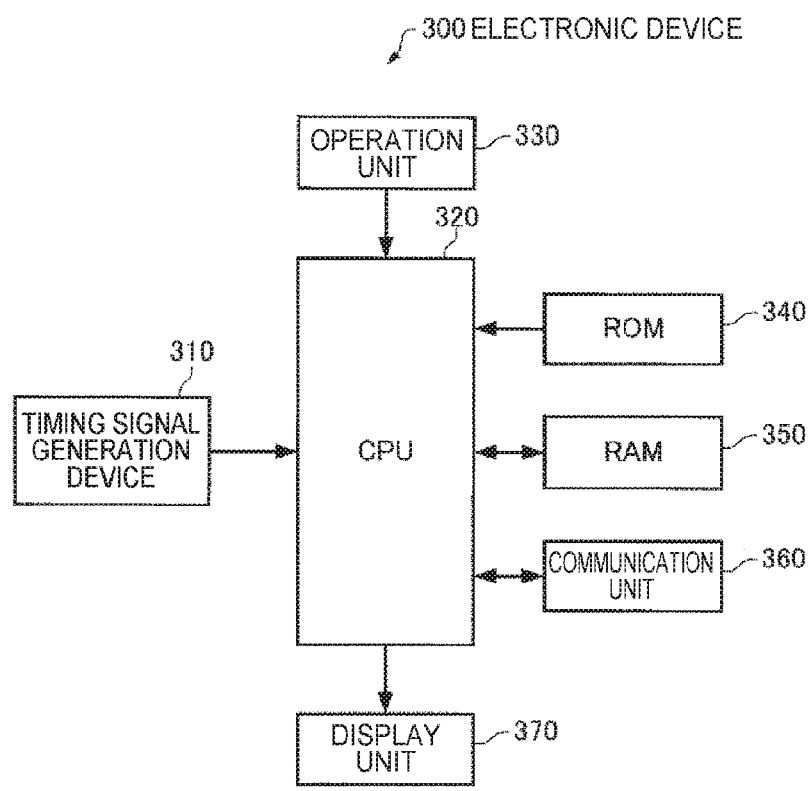
FIG. 13 is a block diagram illustrating an embodiment of an electronic device according to the invention.

FIG. 13 is a block diagram illustrating the embodiment of the electronic device according to the invention.

The electronic device 300 illustrated in FIG. 13 includes a timing signal generation device 310, a central processing unit (CPU) 320, an operation unit 330, a read only memory (ROM) 340, a random access memory (RAM) 350, a communication unit 360, and a display unit 370.

The timing signal generation device 310 is applied as the above-described timing signal generation device 1, for example. As described before, the timing signal generation device 310 receives a satellite signal and generates a timing signal (1 PPS) having high precision, and outputs the generated timing signal outwardly. Thus, it is possible to realize the electronic device 300 with lower cost and high reliability.

The CPU 320 performs various types of calculation processing or control processing, in accordance with a program stored in the ROM 340 and the like. Specifically, the CPU 320 performs types of processing with synchronization with the timing signal (1 PPS) or a clock signal which is output by the timing signal generation device 310. Examples of the performed processing include clocking processing, various types of processing performed in accordance with an operation signal from the operation unit 330, processing of controlling the communication unit 360 so as to perform data communication with the outside of the electronic device, and processing of transmitting a display signal so as to display various types of information by the display unit 370.

The operation unit 330 is an input device configured by operation keys, button switches, or the like. The operation unit 330 outputs an operation signal to the CPU 320 in accordance with an operation by a user.

The ROM 340 stores a program, data, or the like required for causing the CPU 320 to perform various types of calculation processing or control processing.

The RAM 350 is used as a work area of the CPU 320. The RAM 350 temporarily stores a program or data which has been read from the ROM 340, data input from the operation unit 330, computation results obtained by performing of the CPU 320 in accordance with various programs, and the like.

The communication unit 360 performs various types of processing for establishing data communication between the CPU 320 and an external device.

The display unit 370 is a display device configured by a liquid crystal display (LCD) and the like. The display unit 370 displays various types of information based on a display signal input from the CPU 320. A touch panel that functions as the operation unit 330 may be provided in the display unit 370.

Various electronic devices are considered as such an electronic device 300, and the electronic device 300 is not particularly limited. For example, a server (time server) for managing points of time, in which synchronization with a reference point of time is realized, a time management device (time stamp server) that performs issue of a time stamp, and the like, and a frequency reference device such as a base station are exemplified.

3. Moving Object

Figure 14:
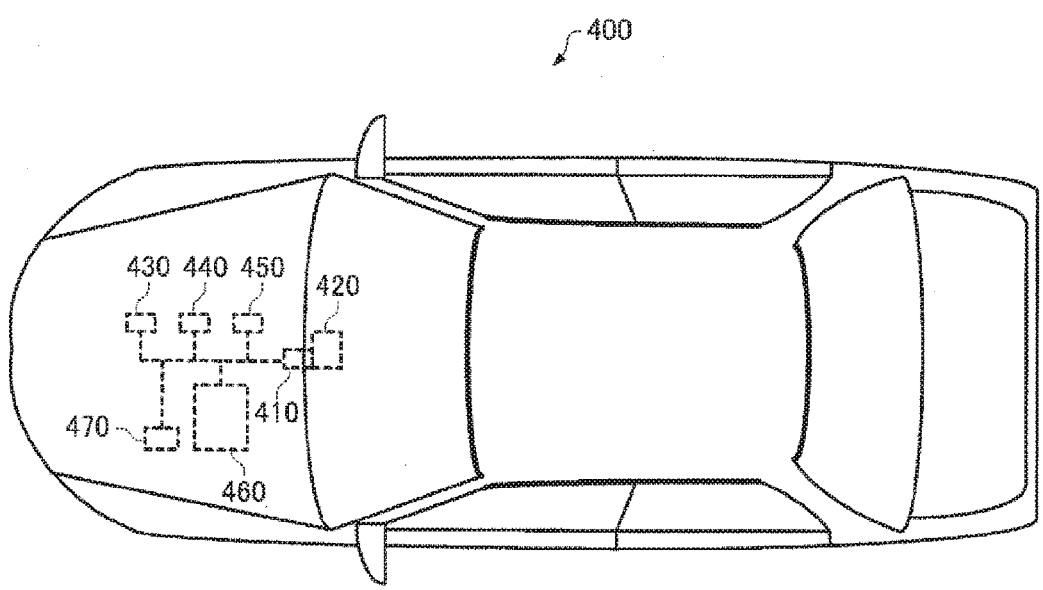
FIG. 14 is a block diagram illustrating an embodiment of a moving object according to the invention.

FIG. 14 is a diagram illustrating an embodiment of the moving object according to the invention.

A moving object 400 illustrated in FIG. 14 includes a timing signal generation device 410, a car navigation device 420, controllers 430, 440, and 450, a battery 460, and a backup battery 470.

The above-described timing signal generation device 1 may be applied as the timing signal generation device 410. The timing signal generation device 410 performs the positioning calculation in real-time in the normal positioning mode, and outputs 1 PPS, a clock signal, and NMEA data, for example, when the moving object 400 is moving. For example, when the moving object 400 stops, the timing signal generation device 410 performs the positioning calculation a plurality of times in the normal positioning mode. Then, the timing signal generation device 410 sets the most frequent value or the median value of results obtained by performing the positioning calculation the plurality of times, as the current position information, and outputs 1 PPS, a clock signal, and NMEA data in the position fix mode.

The car navigation device 420 is synchronized with 1 PPS or the clock signal which is output by the timing signal generation device 410, and displays the position or the point of time thereof, or other various types of information on a display by using the NMEA data which is output by the timing signal generation device 410.

The controllers 430, 440, and 450 perform various controls for an engine system, a brake system, a keyless entry system, and the like. The controllers 430, 440, and 450 may perform various controls with synchronization with a clock signal output by the timing signal generation device 410.

The moving object 400 in the embodiment includes the timing signal generation device 410, and thus it is possible to ensure high reliability in the middle of moving and stopping.

Various moving objects are considered as such a moving object 400. Examples of the moving object 400 include an automobile (also including an electric automobile), an aircraft such as a jet aircraft or a helicopter, a watercraft, a rocket, a satellite, and the like.

Hitherto, the timing signal generation device, the electronic device, and the moving object according to the invention are described based on the embodiment illustrated in the drawings. However, the invention is not limited thereto.

The configuration in the embodiment of the invention may be substituted with any configuration showing similar functions of the above-described embodiment. Any other constituents may be added.

In the above-described embodiment, a timing signal generation device using a GPS is exemplified. However, a global navigation satellite system (GNSS) except for the GPS, that is, for example, Galileo, GLONASS, or the like maybe used.

In the above-described embodiment, the descriptions are made by using a case where the sensor unit includes a temperature sensor, a microwave receiver, a power noise sensor, and a resonance sensor, as an example. However, if the sensor unit includes at least one of these sensors, other sensor may be omitted. The sensor included in the sensor unit is not limited to the above descriptions as long as a sensor enables detecting an environment (disturbance) having an influence on an output result of the phase comparator. For example, a barometer sensor, a photo sensor, and the like may be used as the sensor.

What is claimed is:

1. A timing signal generation device comprising:
a reference timing signal output unit that outputs a reference timing signal;
a first oscillator that outputs a first clock signal;
a first synchronization unit which includes a first divider that divides the first clock signal by counting the first clock signal, and outputs a first division clock signal obtained by the division, a first phase comparator that outputs a signal in accordance with a phase difference between the reference timing signal and the first division clock signal, and a first loop filter which is provided between the first phase comparator and the first oscillator;
a second oscillator that outputs a second clock signal;
a second synchronization unit which includes a second divider that divides the second clock signal by counting the second clock signal, and outputs a second division clock signal obtained by the division, a second phase comparator that outputs a signal in accordance with a phase difference between the first division clock signal and the second division clock signal, and a second loop filter which is provided between the second phase comparator and the second oscillator;
a first count reset unit that enables resetting of a count value of the first divider when switching is performed from a state of stopping the first synchronization unit to a state of operating the first synchronization unit; and
a second count reset unit that enables resetting of a count value of the second divider when switching is performed from a state of stopping the first synchronization unit to a state of operating the first synchronization unit.

2. The timing signal generation device according to claim 1, further comprising:
a first time-constant adjustment unit that reduces a time constant of the first loop filter after the first count reset unit resets the count value of the first divider.

3. The timing signal generation device according to claim 2, wherein
the first time-constant adjustment unit increases the time constant of the first loop filter when a phase difference between the first division clock signal and the reference timing signal is equal to or less than a setting value after the time constant of the first loop filter is reduced.

4. The timing signal generation device according to claim 1, wherein
each of the first count reset unit and the second count reset unit performs resetting when a phase difference between the first division clock signal and the reference timing signal is equal to or more than a setting value in a case where switching is performed from the state of stopping the first synchronization unit to the state of operating the first synchronization unit.

5. The timing signal generation device according to claim 1, wherein
the second count reset unit resets the count value of the second divider after the first count reset unit resets the count value of the first divider.

6. The timing signal generation device according to claim 5, wherein
the second count reset unit resets the count value of the second divider when a phase difference between the first division clock signal and the reference timing signal is equal to or less than a setting value.

7. The timing signal generation device according to claim 1, wherein
a time constant of the first loop filter is more than a time constant of the second loop filter.

8. The timing signal generation device according to claim 1, wherein
long term stability of the first oscillator is higher than long term stability of the second oscillator.

9. The timing signal generation device according to claim 8, wherein
the first oscillator is an atomic oscillator.

10. The timing signal generation device according to claim 8, wherein
the second oscillator is an oven-controlled crystal oscillator.

11. The timing signal generation device according to claim 1, wherein
the reference timing signal output unit outputs the reference timing signal based on a satellite signal.

12. An electronic device comprising:
the timing signal generation device according to claim 1.

13. An electronic device comprising:
the timing signal generation device according to claim 2.

14. An electronic device comprising:
the timing signal generation device according to claim 3.

15. An electronic device comprising:
the timing signal generation device according to claim 4.

16. An electronic device comprising:
the timing signal generation device according to claim 5.

17. A moving object comprising:
the timing signal generation device according to claim 1.

18. A moving object comprising:
the timing signal generation device according to claim 2.

19. A moving object comprising:
the timing signal generation device according to claim 3.

20. A moving object comprising:
the timing signal generation device according to claim 4.

* * * * *